(12) United States Patent
Mori et al.

(10) Patent No.: US 6,673,685 B2
(45) Date of Patent: Jan. 6, 2004

(54) METHOD OF MANUFACTURING SEMICONDUCTOR DEVICES

(75) Inventors: Masahito Mori, Hachioji (JP); Naoshi Itabashi, Hachioji (JP); Masaru Izawa, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/083,397

(22) Filed: Feb. 27, 2002

(65) Prior Publication Data

US 2003/0049876 A1 Mar. 13, 2003

(30) Foreign Application Priority Data

Sep. 6, 2001 (JP) ........................................ 2001-269636

(51) Int. Cl.[7] ............................................. H01L 21/336
(52) U.S. Cl. ........................ 438/302; 438/231; 438/301; 438/525
(58) Field of Search ........................... 438/23, 257, 585, 438/754, 147, 149, 229, 230, 231, 301, 299, 300, 302, 303, 305, 306, 307, 525

(56) References Cited

U.S. PATENT DOCUMENTS

| | | | |
|---|---|---|---|
| 5,368,686 A | * 11/1994 | Tatsumi et al. ............. | 438/696 |
| 6,013,570 A | * 1/2000 | Yu et al. ..................... | 438/595 |
| 6,103,559 A | * 8/2000 | Gardner et al. ............. | 438/183 |
| 6,197,687 B1 | * 3/2001 | Buynoski ..................... | 438/671 |
| 6,323,093 B1 | * 11/2001 | Xiang et al. ................ | 438/299 |
| 6,325,861 B1 | * 12/2001 | Stinnett ......................... | 134/2 |
| 6,392,279 B1 | * 5/2002 | Toyofuku ..................... | 257/408 |
| 6,420,097 B1 | * 7/2002 | Pike et al. .................... | 430/313 |
| 6,440,864 B1 | * 8/2002 | Kropewnicki et al. ...... | 438/710 |
| 6,448,165 B1 | * 9/2002 | Yu et al. ...................... | 438/585 |
| 6,451,647 B1 | * 9/2002 | Yang et al. .................. | 438/240 |
| 6,482,726 B1 | * 11/2002 | Aminpur et al. ............. | 438/585 |
| 2001/0001725 A1 | * 5/2001 | Cheng et al. ................ | 438/595 |
| 2002/0045331 A1 | * 4/2002 | Aminpur ...................... | 438/585 |
| 2002/0110992 A1 | * 8/2002 | Ho ................................ | 438/389 |
| 2002/0164884 A1 | * 11/2002 | Lishan ......................... | 438/739 |

* cited by examiner

*Primary Examiner*—Kevin M. Picardat
(74) *Attorney, Agent, or Firm*—Miles & Stockbridge P.C.

(57) ABSTRACT

A process for economical and efficient fabrication of gate electrodes no larger than 50 nm, which is beyond the limit of exposure, is characterized by gate-electrode trimming and mask trimming with high resist selectivity which are performed in combination. The process is also preferably characterized by performing trimming and drying cleaning in a vacuum environment and may also include steps of inspecting dimensions and contamination in a vacuum environment. The process can be implemented to provide the effects of forming a gate no longer than 50 nm (beyond the limit of exposure) without restrictions on the resist thickness; reducing contamination resulting from transfer of wafers from one step to next, thereby improving yields; preventing resist from hydrolysis by ArF laser, thereby reducing roughening which adversely affects the gate width; and ensuring stable yields despite variation in dimensions and contamination owing to the additional dry cleaning step and feed-forward control based on CD inspection and contamination inspection.

4 Claims, 8 Drawing Sheets

PRIOR ART
FIG. 2(a)
PRIOR ART
FIG. 2(b)
PRIOR ART
FIG. 2(c)
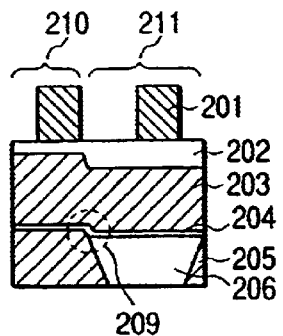
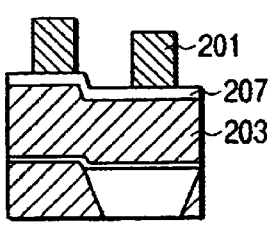
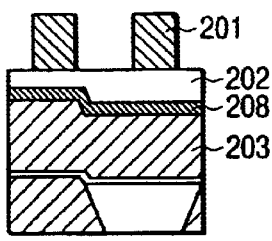
PRIOR ART
FIG. 3(a)
PRIOR ART
FIG. 3(b)
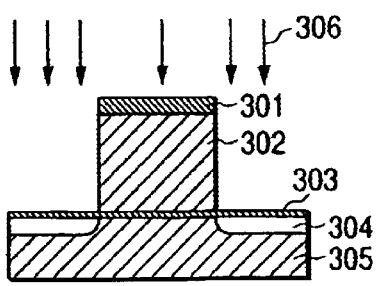
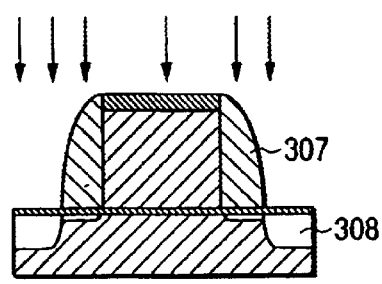

FIG. 5
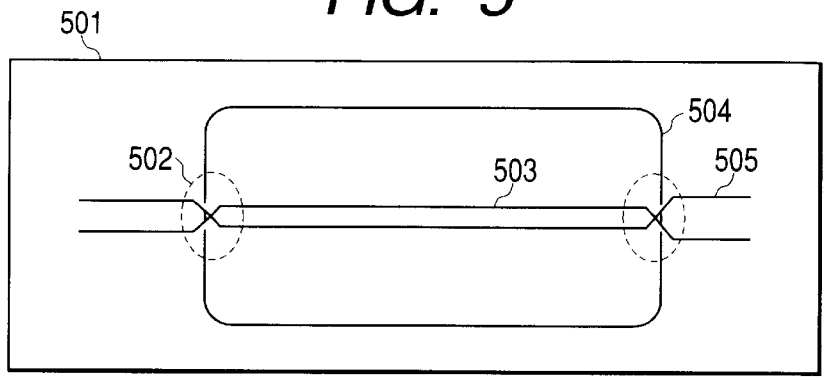
FIG. 6(a)    FIG. 6(b)    FIG. 6(c)
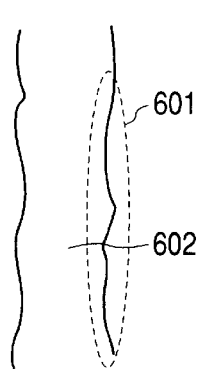 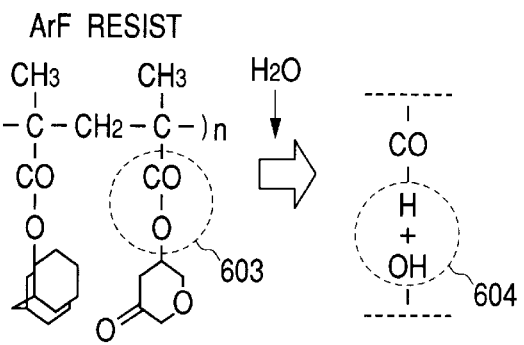 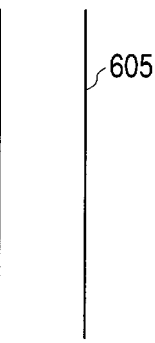
FIG. 7(a)    FIG. 7(b)    FIG. 7(c)
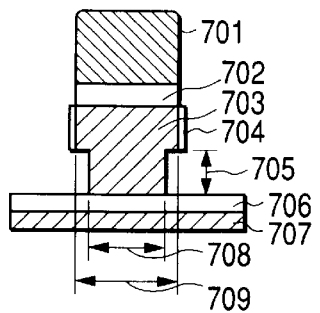 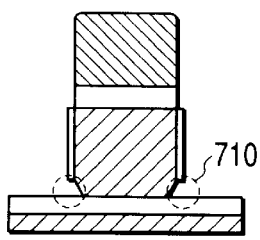 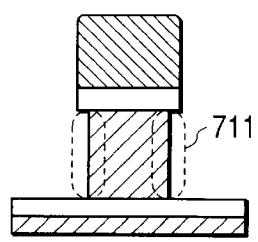

METHOD OF MANUFACTURING SEMICONDUCTOR DEVICES

This application claims the benefit of Japanese Patent Application No. 2001-269636, filed Sep. 6, 2001 and incorporated herein by reference.

BACKGROUND OF THE INVENTION

1. Field of the Invention

The present invention relates to a process for fabrication of semiconductor devices typified by memory LSI and system LSI. More particularly, the present invention relates to a process for efficiently forming a gate electrode of CMOS in a reduced length below 50 nm which is beyond the limit of lithography resolution.

2. Description of the Related Arts

Semiconductor devices fall under two broad categories: memory LSI typified by DRAM and logic LSI (or system LSI) typified by microprocessor (MPU). They are fabricated by several steps, including the formation of a gate electrode. This step consists of forming a gate insulating film, forming a gate electrode film, forming a mask layer, transferring a circuit pattern to the mask layer, etching the gate electrode film, ashing a resist and removing residual halogen gas, and removing (or cleaning) foreign matter (particles) resulting from etching. After the gate electrode has been formed, source and drain regions are formed.

The film-forming step differs in detail depending on the construction of the gate electrode. Usually, the gate insulating film is a thin $SiO_2$ film, and the gate electrode film is a single layer of n-poly-Si or p-poly-Si or a multiple layer of WSi/poly-Si or W/WN/poly-Si. The etching of these films needs an etching mask to which a circuit pattern has been transferred.

The etching mask varies in material and thickness depending on the resolution and the feature size required. For example, requirements for the 0.5-$\mu$m technology node were readily fulfilled by using a conventional resist and an exposure system with a mercury lamp emitting i-line (365 nm in wavelength) light. However, requirements for the 0.18-$\mu$m technology node are met only by using a resist of multi-layer structure (having an antireflection coating film at the bottom) and an exposure system with KrF laser (248 nm in wavelength) and phase-shift mask for ultrahigh resolution. The antireflection coating film may be an organic one (BARC: Bottom Anti-Reflective Coating) or inorganic one (BARL: Bottom Anti-Reflective Layer). FIG. 2(a) is a sectional view of a sample which was taken just after exposure. This sample has an etching mask consisting of resist (201) and BARC (202) and a multi-layer film consisting of poly-Si (203) and $SiO_2$ (204) on a silicon substrate (205). FIG. 2(b) is also a sectional view of a sample which was taken just after exposure. This sample has an etching mask consisting of resist (201) and BARL (207) and a multi-layer film consisting of poly-Si (203) and $SiO_2$ (204).

The BARC film (202) is formed by spin coating in the same way as resist film is formed. It flattens over the step (209) that occurs as the result of shallow trench isolation (206). This flat film is suitable for high-resolution exposure with a small depth of focus. This advantage, however, is offset by the disadvantage involving difficulties in controlling dimensions at the time of etching the BARC film (202) because the amount of overetching differs between the thin part (210) and the thick part (211). On the other hand, the BARL film (207) is composed of such elements as Si, O, and N, and it is formed by CVD such that the resulting film has a uniform thickness along the step on the underlayer. In dry etching, this film gives a uniform amount of overetching and permits easy dimensional control for BARL etching. Unfortunately, from the standpoint of the exposure system, this film is detrimental to resolution on account of the limited depth of focus.

A common procedure to form the mask is as follows. First, the BARC film (202) and the resist film (201) are sequentially formed or the BARL film (207) and the resist film (201) are sequentially formed. Then, after exposure, the BARC film (202) or the BARL film (207) is patterned by dry etching.

There is another type of mask (hard mask) to be used for gate electrode etching. This mask is free of organic matter so that it improves the dimensional accuracy at the time of gate forming and it permits the wide selection of gate insulating film. The hard mask is an $SiO_2$ film or SiN film made from TEOS(Tetra-Ethyl-Ortho-Silicate), HLD (High temperature Low pressure Decomposition), etc. FIG. 2(c) is a sectional view of a sample with a hard mask which was taken just after exposure. The hard mask is usually formed in the following way. The TEOS film (208), the BARC film (202), and the resist film (201) are sequentially formed. After exposure, the BARC film (202) and the TEOS film (208) are patterned by dry etching. Finally, the resist film (201) and the BARC film (202) are removed by ashing. The dry etching and ashing in this procedure are accomplished by using special equipment.

The dry etching used for mask forming and gate etching is usually accomplished by an ion-assisted reaction which involves ions (which occur in plasma generated from a reactant gas in a vacuum chamber) and neutral radicals. A common way to generate plasma is to irradiate the reactant gas (introduced into a vacuum chamber for etching) with electromagnetic waves for dissociation. Typical plasma sources include capacitive coupled plasma (CCP), inductive coupled plasma (ICP), and electron resonance plasma (ECR). CCP and ICP employ electromagnetic waves of 13.56 MHz or 27 MHz, and ECR employs microwaves of 2.45 GHz or UHF of 450 MHz.

The dry etching apparatus with a plasma source is operated by controlling the following parameters so that the etched film has desired dimensions: the species of etchant gas, the processing pressure, and the electromagnetic power, which determine the characteristics of plasma; the sample temperature which determines the characteristics of chemical reactions; and the power of RF bias to draw ions to the sample. The object of etching one kind of film for mask forming and another kind of film for gate etching is achieved by selecting an etchant gas and an apparatus suitable for respective etching reactions. For example, the etching of BARC film for mask forming is carried out by using an etching apparatus with CCP plasma source in which $O_2$ is mixed with $CF_4$ or $N_2$ and plasma is generated from a gas diluted with Ar. Also, the etching of BARL or $SiO_2$ is carried out by using an etching apparatus with CCP plasma source in which plasma is generated from a fluorocarbon gas (such as $C_4F_8$ and $C_5F_8$) diluted with $O_2$ and CO diluted with Ar. The etching of the gate electrode is carried out by using an etching apparatus with ICP or ECR plasma source. The etching of W layer or WSi layer employs $CF_4$ or $SF_6$ incorporated with $Cl_2$, $N_2$, and $O_2$. The etching of poly-Si layer employs plasma generated from $Cl_2$, HBr, or $NF_3$ incorporated with $O_2$ or He.

Ashing to remove the resist and halogen remaining after etching employs plasma generated from $O_2$ by ICP or microwave or employs $O_3$ generated under normal pressure.

(In the former case, reactions are controlled by the sample temperature.) There may be an instance where reactions with the resist are accelerated by incorporating $O_2$ with a fluorocarbon gas such as $CF_4$ and $CHF_3$.

The cleaning step to remove foreign matter and contaminants resulting from etching is accomplished mainly by wet cleaning with a solution, such as aqueous solutions of $NH_4OH/H_2O_2$, $HCl/H_2O_2$, and hydrofluoric acid. The mixing ratio, treating time, and solution temperature may be adequately controlled according to the kind of contaminant.

After the gate electrode has been formed, the source and drain are formed in the following manner, reference being made to FIGS. 3(a) and 3(b) which exemplify the case of using a hard mask. First, as shown in FIG. 3(a), a lightly doped extension (304) is formed by ion implantation which employs the gate electrode as a mask. Second, as shown in FIG. 3(b), a sidewall spacer (307) is formed by deposition and ensuing etching, and a heavily doped extension (308) is formed by ion implantation. The TEOS layer, polysilicon gate electrode film, $SiO_2$ gate insulating film, and silicon substrate are designated as (301), (302), (303), and (305), respectively.

The gate electrode formed by the above-mentioned process has been decreasing in size year after year in order to meet requirements for lower power consumption and higher speed. The recent issue of ITRS (International Technology Roadmap for Semiconductors, 2000, SC.2) predicts that the technology node will be reduced more than that shown in the previous issue, as shown in Table 1.

of BARC etching. Since BARC has a composition similar to that of resist, the trimming of the resist can be accomplished by using the plasma of gas (composed of $O_2$, $CF_4$, $N_2$, and Ar) used for BARC etching.

There are other ways for trimming, such as contriving the mask structure or process flow, performing trimming on the resist, and performing trimming on the gate electrode. Contriving the mask structure or process flow is disclosed in Japanese Patent Laid-open Nos. 209018/1994 and 136402/1993. The former is concerned with a method of forming a miniaturized gate which consists of forming film and performing side etching on dummy L/S (line and space) of $SiO_2$. The latter is concerned with a method of trimming by performing side etching on a specific mask layer of a multi-layered mask.

In addition, Japanese Patent Laid-open No. 78400/1996 discloses a technology for trimming both the mask and the gate electrode simultaneously by treating them with an $SF_x$ gas in the same chamber under the same condition. In the case where the BARL film is used as shown in FIG. 2(b), the resist is trimmed directly by using an ashing apparatus that employs ICP or $O_3$. A method of trimming the gate electrode is disclosed in Japanese Patent Laid-open No. 22396/1995. This method is concerned with trimming the WSi/poly-Si multi-layered gate. Some new technologies have recently be publicized which are concerned with the trimming of the single-layered gate electrode. They achieve the object of trimming the gate electrode by forming notches near the interface with the underlying oxide film (described in IEDM 1999 and Society of Applied Physics 2001 Spring), by

TABLE 1

|  | 1999 | 2000 | 2001 | 2002 | 2003 | 2004 | 2005 |
| --- | --- | --- | --- | --- | --- | --- | --- |
| T.N. predicted in 1999 issue | 180 nm |  |  | 130 nm |  |  | 100 nm |
| T.N. predicted in 2000 (SC.2) | 180 nm |  | 130 nm |  | 100 nm |  |  |
| MPU gate length predicted in 2000 (SC.2) |  |  | 90 nm |  | 70 nm |  |  |
| MPU gate length planned by advanced manufacturers | 130 nm |  | 70 nm |  | 50 nm |  | 35 nm |

T.N. = Technology node

Moreover, advanced semiconductor manufacturers are planning new products to be shipped in 2001 and 2003, which will have a gate length of 70 nm and 50 nm, respectively. These values are ahead of predictions by ITRS. FIG. 4(a) shows a prediction of the decreasing gate length and its corresponding critical dimension over a few years to come. According to this prediction, the critical dimension in 2003 will be 100 nm (as indicated by line 401) and the MPU gate length will be 50 nm (as indicated by line 402). This means that as much trimming as 50 nm is necessary. The critical dimension shown in FIG. 4(a) is based on the assumption that ArF laser (193 nm in wavelength), which is regarded as the new-generation technology, will be used for exposure in 2003 and afterward. At present, however, this new technology is not yet in practical use because of problems with resist materials, exposure characteristics, and apparatus cost.

Up to now, semiconductor manufacturers have attempted to realize small dimensions beyond the limit of exposure by trimming with an etching apparatus (after exposure with an existing exposure tool) or by contriving the mask structure and process flow. For example, in the case where the gate electrode is formed with the help of BARC film as shown in FIGS. 2(a) and 2(c), it has been common practice to perform trimming on both the resist and the BARC mask at the time utilizing the steps of forming a protection film with $O_2$ and side etching (described in Dry Process Symposium 2000), and by forming notches with an H-containing gas such as HCl and HBr (described in ICMI 2001).

If the critical dimension decreases as predicted in FIG. 4(a) (line 401), it would be necessary to reduce the thickness of the resist film accordingly. The resist film necessary for exposure of fine patterns will decrease in thickness as predicted in FIG. 4(b). For resolution of a 100-nm line, the resist film should be thinner than 300 nm. This requirement arises from the fact that the thickness of resist film needs to be less than approximately three times the magnitude of resolution so that the pattern will not be destroyed after exposure by the surface tension of the developing solution. However, the antireflection coating film remains unchanged in thickness even though miniaturization proceeds as shown in FIG. 4(a), because its thickness is precisely determined by its ability to absorb and interfere with exposure light of specific wavelength. Likewise, the gate electrode will have a limit to reduction in its thickness, which is approximately 100 nm. This is because reduction in voltage for dopant implantation is limited and there is possibility of dopant penetrating the gate insulating film due to heat diffusion.

It follows that although the resist film for exposure decreases in thickness (as indicated by line 404) as the gate electrode decreases in length, the films (such as BARC, BARL, hard mask, and gate electrode) to be etched remain unchanged in thickness. For example, line 405 shows the residual thickness of the resist mask after the BARC etching. Line 403 shows the residual thickness of the resist mask necessary for etching the gate electrode. This will pose a problem in 2003 that the thickness of the resist film necessary for etching (indicated by line 403) is insufficient if the resist trimming is accomplished after the BARC etching. See FIG. 4(*b*). Also in the case of the sample with BARL as shown in FIG. 2(*b*), a similar consequence is foreseen from the estimated thickness necessary for etching BARL and poly-Si. In addition, referring to FIG. 5, trimming by BARC etching alone poses a problem with breakage because there is a difference in the amount of overetching between the upper part (503) and the lower part (505) of the step resulting from STI (shallow trench isolation), as schematically shown in the figure. This difference prevents uniform trimming by 50 nm and excess trimming takes place at the step (502) where the amount of overetching is large and the BARC film is thinnest.

On the other hand, the method disclosed in Japanese Patent Laid-open Nos. 209018/1994 and 136402/1993 (mentioned above), which is designed to achieve trimming by contriving the mask structure and process flow, has the disadvantage of increasing the chip cost and decreasing the total throughput due to increased steps. The method disclosed in Japanese Patent Laid-open No. 78400/1996 does not meet requirements for ever-decreasing resist thickness because if the gate electrode is to be anisotropically etched with an F-based gas used for resist trimming, it is necessary to apply an RF bias which also brings about anisotropic etching in the direction of resist thickness. Another disadvantage of this method is that trimming of the mask proceeds faster than trimming of the gate electrode and hence the gate electrode tends to assume a forwardly tapered shape and there are difficulties in controlling critical dimensions (CD). In the meantime, it would be difficult to achieve trimming of the gate electrode by as much as 50 nm in view of the fact that the $SiO_2$ layer becomes as thin as approximately 1 nm. So long as trimming resorts to side etching with high selectivity for the underlayer, an amount of trimming as much as 20–30 nm would be a limit without underlayer loss.

Moreover, the conventional method, which consists of performing resist trimming, BARC trimming, and gate electrode trimming in different apparatuses and transferring wafers from one apparatus to another in the atmosphere, poses a problem with contamination from the apparatus and the atmosphere. One way to tackle this problem is to add a cleaning step; however, this in turn poses another problem with decrease in throughput and increase in production cost due to additional COO (cost of ownership). Further, referring to FIG. 6(*a*), it is reported that resist (602) exposed to ArF laser is subject to surface roughening on the side wall as indicated by (601). This surface roughness should be reduced to prevent the variation of gate dimensions.

OBJECT AND SUMMARY OF THE INVENTION

The present invention was completed with the foregoing problems taken into account. It is an object of the present invention to provide an etching process for gate electrodes as short as 50 nm, exceeding the limit of exposure.

According to the present invention, it is possible to solve the problem arising from the ever-decreasing thickness of the resist to meet requirements for miniaturization anticipated in 2003 onward and the problem with insufficient trimming of the gate electrode which occurs if underlayer loss is to be avoided. These problems are solved by using, in combination, gate electrode trimming with high resist selectivity and trimming at the time of mask forming.

According to the present invention, it is possible to reduce variation in trimming and to realize high-precision processing. These objects are achieved by reducing the difference in the amounts of overetching at the step arising from the STI process by minimizing the amount of overetching for BARC trimming. Variation in dimensions at the time of BARC etching due to the step arising from STI occurs because the amount of trimming increases on account of insufficient reaction products produced during overetching for BARC trimming. In other words, difference in the amount of overetching causes variation in the amount of trimming.

According to the present invention, it is possible to solve problems arising from ever-increasing complexity in the process for fabrication of semiconductor devices, because the process of the present invention does not need any special mask structure or any change in gate structure.

According to the present invention, it is possible to solve the problems with contamination by foreign matter that occur while wafers are being transferred from one apparatus to another. (Contamination is the major cause to decrease yields.) The solution is achieved by performing mask trimming and gate electrode trimming in a vacuum environment.

According to the present invention, it is possible to solve the problems with decrease in throughput, disposal of washing solution, and increase in cost of ownership (COO), all of which result from the additional cleaning step. This object is achieved because the process of the present invention permits dry cleaning to be performed in a vacuum environment. Dry cleaning in this manner prevents the water absorption of hydrogen halide compounds remaining after dry etching. This permits the wet cleaning to be eliminated or simplified.

According to the present invention, it is possible to control dimensions highly accurately and to realize very small gates (on the order of 50 nm) in high yields. This object is achieved by carrying out the step of inspecting dimensions or contamination in a vacuum environment and feeding the results of inspection to the subsequent steps for their adjustment.

According to the present invention, it is possible to solve the problem with the roughening of resist film patterned by ArF laser. This object is achieved by not exposing wafers to the atmosphere, because the problem arises from hydrolysis in the atmosphere as shown at (603) and (604) in FIG. 6(*b*).

BRIEF DESCRIPTION OF THE DRAWINGS

FIGS. 2(*a*)–2(*c*) are alternative sectional views of the gate electrode (before trimming) of a CMOS transistor.

FIGS. 3(*a*) and 3(*b*) are sectional views of the gate electrode and adjacent structures formed by the conventional source/drain forming step.

FIG. 5 is a schematic diagram (observed under a critical dimension scanning electron microscope) showing the line crossing the step due to STI after BARC etching.

FIG. 6(*a*) is a diagram showing a roughened line (viewed from above) of a resist exposed by ArF laser and processed in the conventional way; FIG. 6(b) is a diagram illustrating the hydrolysis of the resist exposed by ArF laser; and FIG. 6(c) is a diagram showing a smooth line which results from trimming according to the process of the present invention.

FIGS. 7(a)–7(c) are alternative sectional views of the gate electrode which has been trimmed by the process of the present invention.

DESCRIPTION OF THE PREFERRED EMBODIMENTS

EXAMPLE 1

Figure 1A:
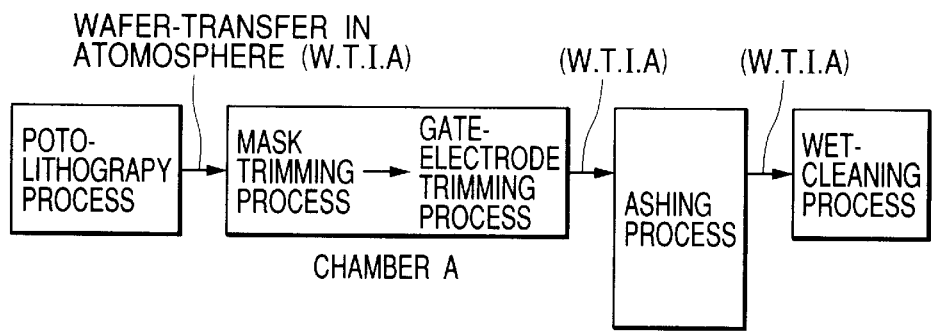
FIGS. 1(*a*) and 1(*b*) are process flow diagrams for forming the gate electrode according to the present invention.

This example demonstrates a fabrication process in which mask trimming and gate-electrode trimming are performed in the same chamber under different conditions. FIG. 1(a) is a flow diagram of forming the gate electrode. The flow diagram starts with the photolithography to form the mask. The mask and the gate electrode undergo trimming in the same chamber A (which is a UHF-ECR etching apparatus for the gate) and are thereafter transferred to another chamber for ashing, as shown in FIG. 1(a).

The process in this example is intended to realize a gate length of 50 nm from a multi-layered film as shown in FIG. 2(a). This multi-layered film consists of three films as follows.
Resist film (201) . . . 300 nm thick
BARC film (202) . . . 65 nm thick (thin portion)
Poly-Si film (203) . . . 100 nm thick
The resist film has a pattern width of 100 nm formed by exposure to ArF laser.

Figure 4A:
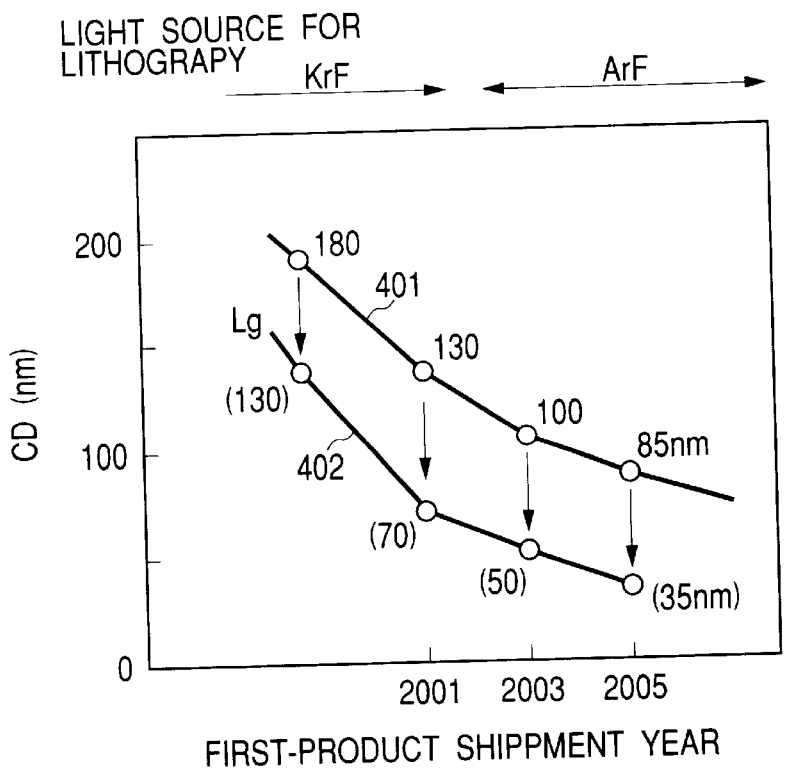
FIG. 4(*a*) is a graph showing predicted decrease in gate length and the corresponding critical dimension, and FIG. 4(*b*) is a graph showing predicted residual resist thickness and limit of fabrication.
Figure 4B:
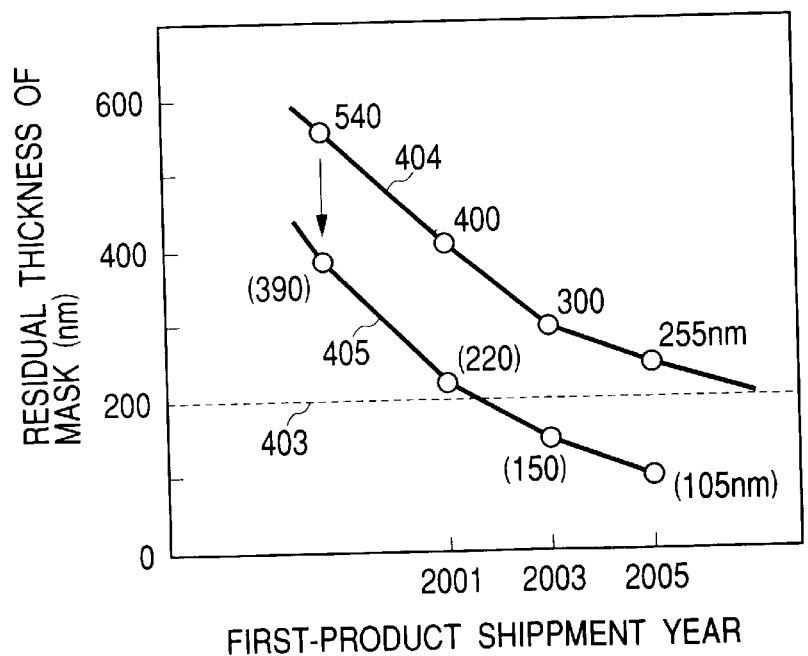

The mask thickness (indicated by 403 in FIG. 4(b)) necessary for etching such a gate is calculated as follows:

(Film thickness of gate electrode)×(Resist selectivity)×(Ratio of mask edge to mask center)+(Film thickness with allowance for safety)     (Formula 1)

In this example, this formula gives 100×3×2/3+20=220 nm if the following is assumed.
Film thickness for gate electrode: 100 nm
Resist selectivity: 3
Ratio of mask edge to mask center: 2/3
Residual film thickness with allowance for safety: 20 nm The result of calculations suggests that the amount of resist loss in the mask trimming process should be no more than 80 nm.

First, the mask trimming process (i.e., resist trimming) with $O_2$ plasma was carried out in the UHF-ECR etching chamber A for the gate as shown in FIG. 1(a). The result of this process indicated that resist etching (thickness direction) and resist trimming (sidewall direction) proceeded at a ratio of 1/1. Under this condition, resist trimming was carried out 20 nm, so that the remainder of the resist was 280 nm. Second, BARC etching with $O_2/CF_4$/Ar gas was carried out in the UHF-ECR etching chamber A for the gate (the same one as mentioned above). The result of this process indicated that BARC etching and BARC trimming proceeded at a rate of 3/1. With the gas composition and RF bias properly controlled, BARC etching was carried out such that the amount of trimming by BARC etching was 20 nm. The remainder of the resist was 220 nm. In this way it was possible to let the resist have a residual thickness necessary for the gate-electrode trimming process. And after, the gate electrode trimming process is carried out in the UHF ECR etching chamber A as shown in FIG. 1(a). Namely, the remaining 10 nm was trimmed away in the gate-electrode trimming process. Thus, there was obtained the 50-nm gate. In this way it is possible to obtain the gate electrode by changing the condition for gate etching and timely switching the conditions. FIGS. 7(a) to 7(c) are alternative sectional views showing the gate electrode after trimming.

The gate electrode with a shape shown in FIG. 7(a) is formed by vertically etching the poly-Si film (703) as usual while forming a sidewall protection film (704), with the resist film (701) and the BARC film (702) functioning as a mask, and then performing overetching for trimming, with the condition changed such that the sidewall protection film (704) is not formed any longer. The composition of the sidewall protection film (704) comprises $Si_{(x)}Br_{(y)}$ or $Si_{(x)}Cl_{(y)}$ or $SiO_{(x)}$, for example. Overetching for trimming employs a mixed gas such as $HBr/O_2$, $HCl/O_2$, and $HCl/O_2/HBr$, which has a high underlayer selectivity and readily brings about side etching. When to switch the first condition for etching that forms the sidewall protection film (704) to the second condition for etching that does not form the sidewall protection film, may be determined by measuring the etching time and by detecting the film thickness with an interference thickness tester. In this way it is possible to change the height of trimming (705). The thus obtained gate electrode has a gate length (708) which is smaller by 10 nm than the mask dimension (709) of the resist (701) and BARC (702). Reference numbers (706) and (707) indicate the gate insulation film and the substrate, respectively. If the gate electrode etching is carried out with the first condition omitted (or in such a way as to form maintain a sidewall protection film), there is obtained a gate electrode as shown in FIG. 7(b). This gate electrode is trimmed as much as 10 nm owing to the notch (710). Alternatively, if the gate electrode etching is carried out vertically only under the second condition (or in such a way as to form no sidewall protection film) and the gate electrode is entirely trimmed as at (711) by overetching subsequently, there is obtained a gate electrode as shown in FIG. 7(c). After the gate trimming process, the ashing process for removing the resist and the cleaning process for reducing the contaminants are carried out as shown in FIG. 1(a).

In this example, the steps of forming the gate electrode were carried out continuously in the same chamber under different conditions as mentioned above. In this way it was possible to reduce the number of contaminants to one-sixth of that in the conventional process which causes wafers to be transferred from one apparatus to another in the atmosphere. Also, in this example, both resist trimming and BARC trimming were carried out in a vacuum environment. In this case it was possible to reduce roughening on the resist sidewall as shown at (605) in FIG. 6(c) by preventing the resist from hydrolysis. Moreover, in this example, BARC trimming was so carried out as to reduce the amount of trimming. In this way it was possible to reduce the difference in the amounts of overetching (resulting from the step (209) that occurs during the process of STI) between the thin part (210) and the thick part (211) of BARC film below 2 nm.

The process in this example, which employs a mask composed of resist and BARC, should meet the requirements for the resist thickness and the trimming amount as follows. The resist thickness (in nm) necessary for the poly-Si film to be etched is calculated from Formula (1) as 2×(thickness of film to be etched)+20. In view of the fact that the ratio of BARC etching rate to BARC trimming amount is 3, it is necessary that the resist have a thickness calculated from Formula (2) before BARC trimming.

$$2\times(\text{thickness of film to be etched})+20+ (\text{trimming amount})\times 3 \quad \text{(Formula 2)}$$

In other words, if the thickness of the resist film after exposure is smaller than that calculated from Formula (2), then BARC trimming is not enough for desired trimming, and trimming needs more than one chamber or more than one etching step. Accordingly, as depicted above in this example, the process of the present invention is applicable for achieving trimming more than 50 nm from the critical dimension of 100 nm and realizing the gate length smaller than 50 nm in high yields. In the above example, in order to further reduce the number of contaminants, the ashing process may be carried out in the chamber A under a plasma condition which is different from the trimming step conditions. Also, the dry cleaning process (the dry cleaning step) can be applied instead of the wet cleaning process. In this case, the dry cleaning process may be carried out in the chamber A under another plasma condition.

EXAMPLE 2

Figure 1B:
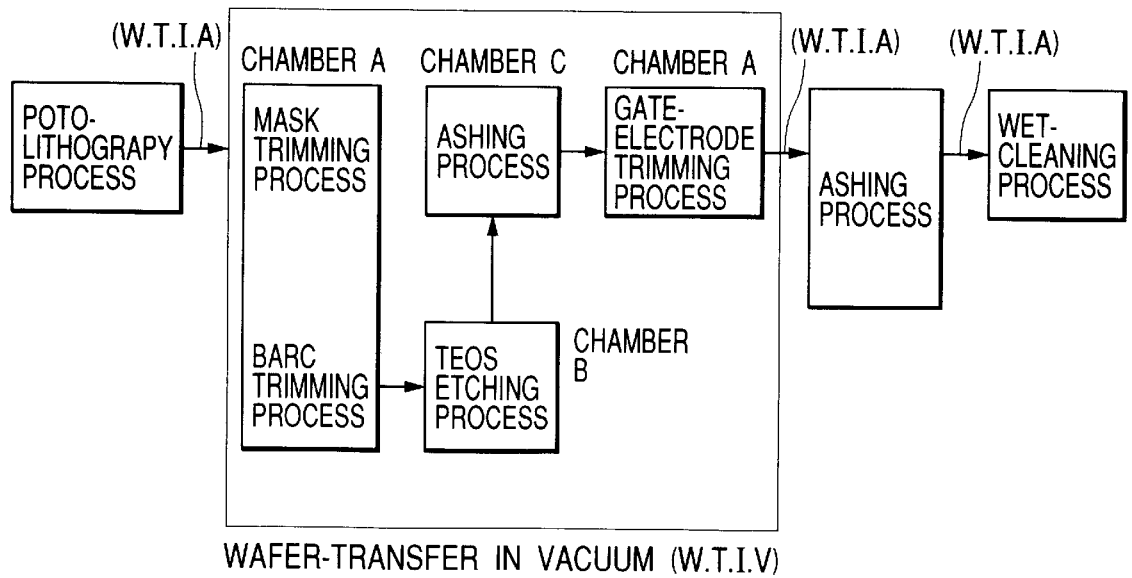

This example demonstrates a fabrication process in which resist trimming and gate trimming are performed in different chambers as shown in FIG. 1(b). The process is intended to realize a gate length of 50 nm from a multi-layered film as shown in FIG. 2(c). This multi-layered film consists of four layers as follows.

The process mentioned above may be slightly modified as shown in FIG. 8(b) to produce the same effect. The modified process uses five steps including performing resist trimming in chamber C (such as ICP plasma asher), performing BARC trimming and TEOS etching in chamber B (UHF-ECR chamber for oxide film), performing ashing in chamber C, and performing gate-electrode trimming in chamber A. Transfer of wafers from one chamber to another is accomplished in a vacuum environment without exposure to the atmosphere. The process shown in FIG. 8(b) may be modified further such that resist trimming, BARC trimming, and TEOS etching are performed all together in the same chamber B (UHF-ECR chamber for oxide film).

The advantage of transferring wafers in a vacuum environment is that the number of contaminants is reduced almost by half from that in the conventional process of transferring wafers in the atmosphere, as shown in Table 2.

TABLE 2

(Number of contaminants: pieces)

| | Mask trimming | CD measurement | BARC etching | Gate etching/ trimming | Total |
|---|---|---|---|---|---|
| Transfer in the atmosphere | 30 | 10 | 30 | 30 | 100 |

TABLE 2-continued (Number of contaminants: pieces)

| | Mask trimming | CD measurement | BARC etching | Gate etching/ trimming | Total |
|---|---|---|---|---|---|
| Transfer in a vacuum environment | 15 | 5 | 15 | 15 | 50 |

The foregoing results suggest an improvement in yields by 3% if it is assumed that one half of contaminants are present before processing and one half of contaminants have no effect on chips. This improvement in yields generates a profit of 15,000 yen per wafer, assuming a chip price of 1000 yen.

The process in this example, which employs a mask composed of resist, BARC, and TEOS as mentioned above, should meet the requirements for the resist thickness and the trimming amount as follows. The resist thickness (in nm) necessary for etching the TEOS layer to be etched is calculated from Formula (3) as (thickness of film to be etched)×4+20. In view of the fact that the ratio of BARC etching rate to BARC trimming amount is 3, it is necessary that the resist have a thickness calculated from Formula (4) before BARC trimming.

$$(\text{thickness of film to be etched})\times 4+20+ (\text{trimming amount})\times 3 \quad \text{(Formula 4)}$$

In other words, if the thickness of the resist film after exposure is smaller than that calculated from Formula (4), then BARC trimming is not enough for desired trimming, and trimming needs more than one chamber or more than one etching step. Accordingly, the present invention is applied.

As mentioned above, in the case where the mask and gate electrode material are formed from a multi-layered film, an effective approach is to perform individual steps in different chambers and to transfer wafers from one chamber to another in a vacuum environment. The multi-layered gate electrode structure to which the process of the present invention may be applied includes those of PR/BARC/SiN/ WSi/poly-Si, PR/BARC/SiN/W/WN/poly-Si, and PR/BARC/TEOS/poly-Si/SiGe. In this case, the layer of PR/BARC/SiN or PR/BARC/TEOS constituting the mask should be processed in the chamber for oxide film and the layer of WSi/poly-Si, W/WN/poly-Si, or poly-Si/SiGe should be processed in the chamber for the gate. And transfer of wafers from one chamber to next should be carried out in a vacuum environment to produce the desired effect.

Now, another process is explained which is intended to realize a gate length of 50 nm from a multi-layered film as shown in FIG. 2(b). This multi-layered film consists of three layers as follows.

Resist layer (201) . . . 300 nm thick
BARL layer (207) . . . 25 nm thick
Poly-Si layer (203) . . . 100 nm thick The resist layer has a pattern width of 100 nm formed by exposure to ArF laser. If the trimming of the gate electrode is to be performed with the resist mask remaining, the resist layer (201) should have a thickness of 280 nm, which is the sum of the thickness of 220 nm (calculated from Formula (1) before the gate electrode etching) and the thickness of 60 nm (calculated from Formula (5) as follows), with BARL etching taken into consideration.

$$25 \times 1.2 \times 1 \times 2/1 = 60 \text{ nm} \qquad \text{Formula (5)}$$

(where it is assumed that the resist selectivity is 1, the ratio of mask edge to mask center is 2/1, and BARL overetching is 30%.) This is achieved by trimming the resist by 20 nm.

Figure 8A:
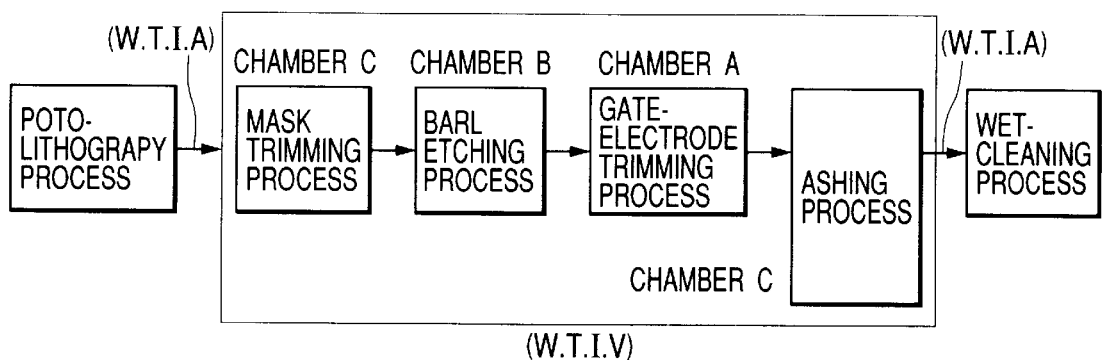
FIG. 8(a) is a flow diagram of trimming the gate film of resist/BARL/poly-Si, and FIG. 8(b) a flow diagram of trimming the gate film of resist/BARC/TEOS/poly-Si, both according to the process of the present invention.
Figure 8B:
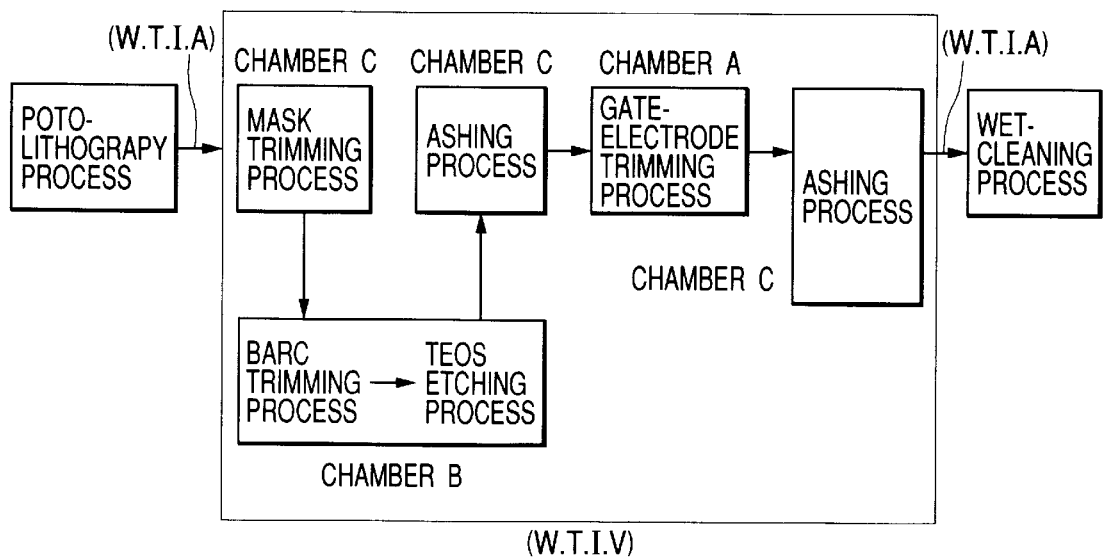

The actual steps employed are illustrated in FIG. 8(a). First, the resist trimming as much as 20 nm was carried out in chamber C (such as ICP plasma asher and microwave asher). The residual thickness of the resist was 280 nm. Second, the BARL etching was carried out in chamber B (UHF-ECR chamber for oxide film). Third, the gate-electrode trimming as much as 10 nm was carried out in chamber A (UHF-ECR chamber for gate). Thus there was formed a 50-nm gate. Finally, ashing was carried out in chamber C (such as ICP plasma asher and microwave asher) to remove the resist and to remove halogen compounds resulting from etching.

The process which employs the resist/BARL mask shown above should meet requirements for the resist thickness as follows. The resist thickness (in nm) necessary for poly-Si etching is calculated from Formula (1) as (thickness of gate electrode film)×2+20, and the resist thickness (in nm) necessary for BARL etching is calculated from Formula (5) as (BARL thickness)×2.4. Consequently, before BARL etching, the resist film should have a thickness calculated from Formula (6) below.

(thickness of gate electrode)×2+20+
(BARL thickness)×2.4                              Formula (6)

In other words, if the thickness of the resist film after exposure is smaller than that calculated from Formula (6), then resist trimming cannot be carried out. Thus, trimming needs more than one chamber or more than one etching step. Accordingly, the present invention is applied.

The process of the present invention, in which BARL etching is carried out in a separate chamber, may be modified such that resist trimming, BARL etching, and gate-electrode etching are carried out in the same chamber as in Example 1. This modification is possible because BARL film is an SiON film which can be etched more easily than $SiO_2$ and its thickness is as small as 20–30 nm. The thus modified process also permits fabrication of miniaturized gates in high yields.

Alternatively, the process of trimming the sample shown in FIG. 2(a), which is carried out in the same chamber, may be modified such that the step of trimming the resist/BARC mask is carried out in one chamber and the step of trimming the gate electrode is carried out in another chamber, with wafers being transferred from one chamber to next in a vacuum environment without exposure to the atmosphere. Transfer in a vacuum environment can be best achieved by arranging a plurality of chambers in a cluster module. Evacuating the cassette case is also effective in avoiding hydrolysis that causes deleterious roughening.

The process in this example can also be applied to the metal gate structure of $W/Ta_2O_5$ or the like. The gate as shown in FIGS. 7(a) and 7(b) can also be formed if W etching is carried out by using, in combination, an F-based gas for side etching and an N-based gas for sidewall protection. In addition, the process of the present invention may be applied to the poly-Si dummy gate used to form the metal gate (replacement gate) by damascene process.

EXAMPLE 3

This example demonstrates the effect of transferring wafers in a vacuum environment throughout all the steps of mask trimming, gate-electrode etching/trimming, ashing, and dry cleaning. Passing wafers through the ashing step without exposure to the atmosphere permits water-absorbing foreign matter to be removed in the case where the gate trimming is carried out by using a hygroscopic halide such as HCl and HBr.

Figure 11A:
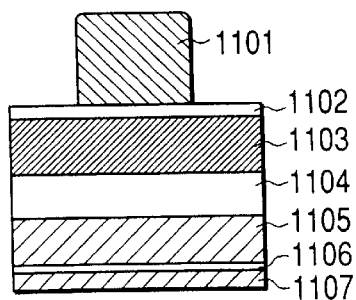
FIGS. 11(a) and 11(b) are sectional views for explaining an example in which the process of the invention is applied for trimming a multi-layered gate.
Figure 11B:
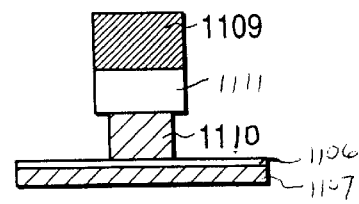

In this example, the trimming process mentioned in Example 2 was applied to the multi-layered gate consisting of resist (1101), BARC (1102), SiN (1103), W (1104), WN (1105), and poly-Si (1106) on a gate insulating film (1107), as shown in FIG. 11(a). The W layer was etched with plasma containing Cl, O, and N, and the poly-Si layer was etched and trimmed with plasma containing Cl, O, and HBr. The trimmed gate has a shape shown in FIG. 11(b), including SiN (1109), W (1111), and WN (1110). After the etching/trimming step, wafers are transferred in a vacuum environment to the dry cleaning step, which removes $SiO_x$ and $WO_x$ formed from SiHCl and W remaining on wafers by reaction with $H_2O$ and $O_2$ in the atmosphere. The process in this manner results in high yields of devices which need low contact resistance.

EXAMPLE 4

The process in Examples 1 to 3 employed a UHF-ECR plasma etching apparatus; however, this apparatus may be replaced by the one with a different plasma source so as to produce devices having a gate length of 50 nm or under (which exceeds the limit of exposure).

The UHF-ECR plasma etching apparatus prevents excessive radical dissociation owing to medium density and low electron temperature. As compared with the conventional apparatus with high density plasma, it suffers less variation in etching amount due to difference in doping density and dopant species (p and n). Moreover, as compared with the apparatus with ICP or CCP plasma, it can control the horizontal distribution more easily owing to the characteristics of its electromagnet. Owing to this advantage, the process in this example performs etching with feed-forward control in a UHF-ECR plasma etching chamber.

Figure 9A:
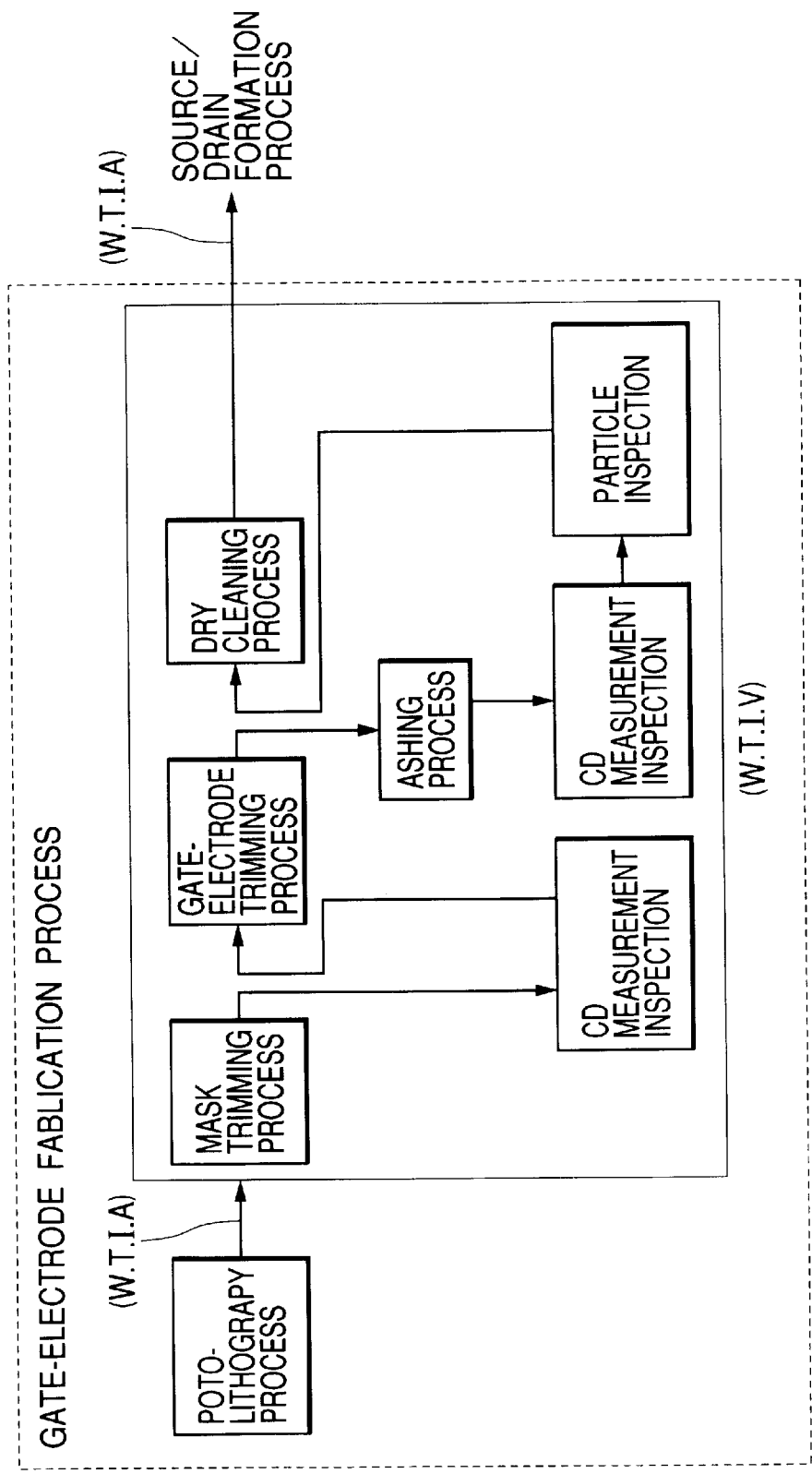
FIG. 9(a) is a flow diagram of a process for forming the gate electrode using feed-forward control.
Figure 9B:
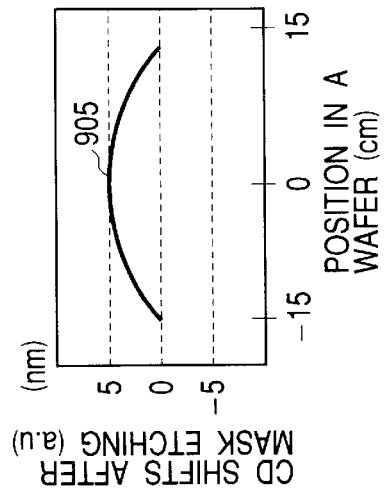
FIGS. 9(b)–9(g) are views for explaining certain details of the process shown in FIG. 9(a).
Figure 9C:
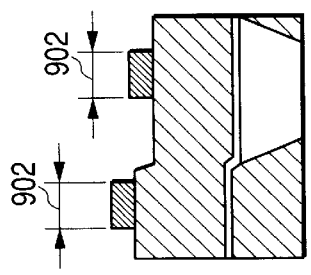
Figure 9D:
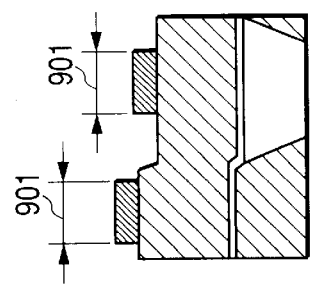
Figure 9E:
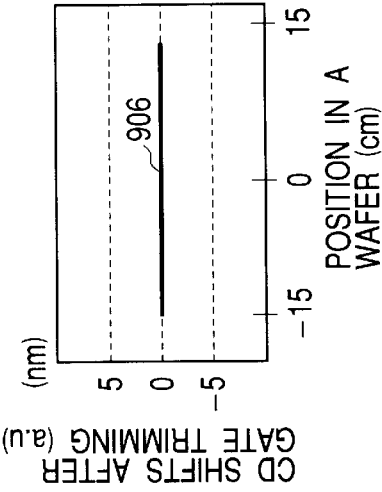
Figure 9F:
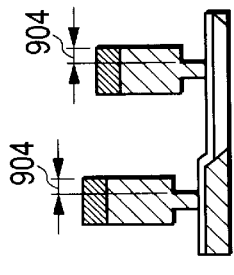
Figure 9G:
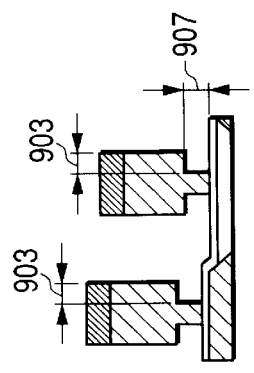

FIG. 9(a) is a flow diagram illustrating the trimming of the sample shown in FIG. 2(c). First, mask trimming was carried out in the same way as in Example 2. Then, the sample was inspected for critical dimensions (CD) during transfer in a vacuum environment. The CD inspection was accomplished by using a critical dimension scanning electron microscope. This object may be achieved also by scattermetry using light scattering, atomic force microscopy, or in-line microsampling by FIB method (focused ion beam). FIG. 9(d) shows the horizontal distribution (905) of the mask dimension which was measured after the completion of mask trimming. It is to be noted that the dimension (901) of TEOS at the wafer center is larger by 5 nm than the dimension (902) of TEOS at the wafer edge. FIG. 9(b) is a schematic diagram showing the cross section at the wafer center, and FIG. 9(c) a schematic diagram showing the cross section at the wafer edge. If this result is obtained, it is necessary to control the horizontal distribution in the subsequent gate-electrode etching/trimming step such that the amount of side etching (903) at the wafer center (FIG. 9(e)) is larger by 2.5 nm than the amount of side etching (904) at the wafer edge (FIG. 9(f)). Trimming height is indicated by (907) in FIG. 9(e). In this way it was possible to realize the gate length which is uniform (as a whole) within the plane as shown by the distribution (906) in FIG. 9(g). Processing with a UHF-ECR etching apparatus makes it possible to easily control the horizontal distribution by adjusting the current flowing through the electromagnet. The same effect as above may be produced by using a microwave ECR etching apparatus; however, a UHF-ECR etching apparatus is more suitable for fabrication with a minimum of variation in CD and a minimum of variation in etching due to doping.

The above-mentioned CD inspection may be carried out not only before the step of gate electrode trimming but also after the step of resist trimming or BARC trimming, so that the result of inspection is utilized to adjust the condition of subsequent etching. According to the process in this example, wafers underwent gate-electrode etching/trimming and then ashing for removal of residual halogen. After these steps, wafers were transferred to a CD inspection chamber. The CD inspection step was followed by contaminant (particle) inspection. According to the amount of contaminant, the condition (duration and gas composition) of dry cleaning was controlled. In this way it was possible to improve the yield which is affected by temporal variation.

EXAMPLE 5

Figure 10A:
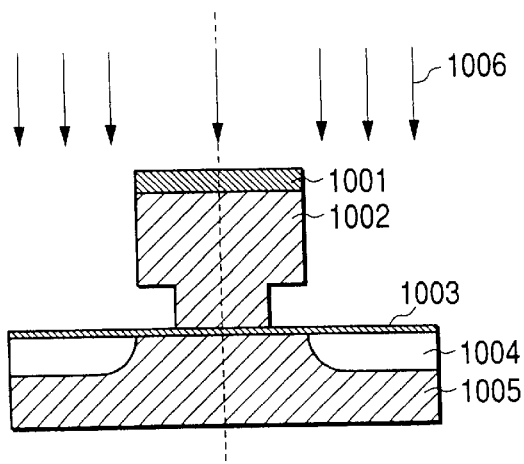
FIGS. 10(a) and 10(b) are sectional views of the gate electrode and adjacent structures formed by the source/drain forming step according to the process of the present invention.
Figure 10B:
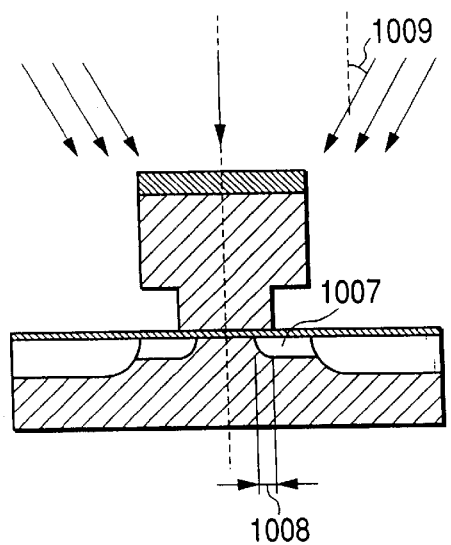

This example demonstrates a process using a gate formed as previously described and having a shape corresponding to either of those shown in FIG. 7(a) or 7(b). This process is designed to form the lightly doped drain with a lightly doped extension by the same implantation step. The process is illustrated in FIGS. 10(a) and 10(b), which show an electrode structure with TEOS (1001), poly-Si (1002), and gate insulating film (1003) by way of example. The electrode is formed on the p-type silicon substrate (1005) with a doping concentration of about $10^{17}/cm^3$, by the process explained in Examples 1 to 4 above. The process of this example dispenses with cleaning steps on account of low contamination level.

After the electrode has been formed, a highly-doped extension (1004) is formed by arsenic ion implantation with an implant energy of 40 keV and an implant dose of $2 \times 10^{15}/cm^2$. The direction of ion implantation is perpendicular to the gate electrode, as shown in FIG. 10(a). Then the lightly-doped extension (1007) is formed by phosphorus ion implantation with an implant energy of 20 keV and an implant dose of $2 \times 10^{13}/cm^2$. The direction of ion implantation is 30° aslant to the wafer, as shown in FIG. 10(b). Ion implantation in this manner (with the second one in an inclined direction as indicated by 1009) makes it possible to form the heavily doped extension and the lightly doped extension continuously without the need of forming a spacer film. Incidentally, the region (1008) of the lightly doped extension which extends beneath the gate electrode may be a hindrance to increasing device speeds. However, this region may be decreased by adjusting the horizontal amount and the height of gate electrode trimming, the angle (1009) of ion implantation, and the diffusion temperature.

[Effect of the Invention]

Formation of a gate shorter than 50 nm (beyond the limit of exposure) without restrictions on the resist thickness. (This gate length is smaller than predicted in the 1999 version of Roadmap.)

Reduction of contamination resulting from transfer of wafers from one trimming step to next. This contributes to improvement in yields per silicon wafer.

Prevention of resist from hydrolysis associated with processing by ArF laser. This reduces roughening which adversely affects the gate width.

Stable yields for mass production owing to feed-forward control based on CD inspection and contamination inspection.

Reduction in the number of steps to be performed after the gate electrode has been formed, which leads to reduction in the semiconductor cost. This object is achieved by forming the trimmed gate, as shown in FIG. 7(a) or 7(b), for example, and then forming the lightly-doped extension and the heavily-doped extension sequentially by using the same ion implantation step.

What is claimed is:

1. An improved process for fabrication of a semiconductor device, comprising a step of forming a mask on a film from which a gate electrode is formed and transferring a circuit pattern to said mask, a step of trimming the mask in which a pattern dimension of said mask is reduced from a pattern dimension produced by exposure of the mask, and a step of gate-electrode etching/trimming in which the gate electrode having a dimension corresponding to but smaller than said reduced dimension is formed, wherein said mask trimming step and said gate-electrode etching/trimming step are performed in a same chamber under different conditions, wherein a dry cleaning step and an ashing step are included and at least two of the mask trimming step, the gate-electrode etching/trimming step, the ashing step, and the dry cleaning step are carried out in different chambers and wafer transfer from one said chamber to another is performed in a vacuum environment, and wherein the wafer is inspected for dimensions and contaminants while being transferred without exposure to atmosphere through the mask trimming step, the gate-electrode etching/trimming step, the ashing step, and the dry cleaning step, and results of each inspection are used to control a condition of a subsequent step.

2. An improved process for fabrication of a semiconductor device, comprising a step of forming a mask on a film from which a gate electrode is formed and transferring a circuit pattern to said mask, a step of trimming the mask in which a pattern dimension of said mask is reduced from a pattern dimension produced by exposure of the mask, and a step of gate-electrode etching/trimming in which the gate electrode having a dimension corresponding to but smaller than said reduced dimension is formed, wherein said mask trimming step and said gate-electrode etching/trimming step are performed in different chambers and wafer transfer from one said chamber to another is performed in a vacuum environment, wherein a dry cleaning step and an ashing step are included and at least two of the mask trimming step, the gate-electrode etching/trimming step, the ashing step, and the dry cleaning step are carried out in different chambers and wafer transfer from one said chamber to another is performed in a vacuum environment, and wherein the wafer is inspected for dimensions and contaminants while being transferred without exposure to atmosphere through the mask trimming step, the gate-electrode etching/trimming step, the ashing step, and the dry cleaning step, and results of each inspection are used to control a condition of a subsequent step.

3. The process for fabrication of a semiconductor device as defined in claim 1 or 2, which further comprises steps of forming, on a substrate, a heavily doped extension and a lightly doped extension to provide a source or drain region adjacent to the gate electrode, and wherein a dimension of an upper part of the gate electrode in a direction of the gate length is greater than the gate length.

4. The process for fabrication of a semiconductor device as defined in claim 1 or 2, wherein the gate has a length no larger than 50 nm.

* * * * *